US009581674B2

(12) United States Patent
Hess et al.

(10) Patent No.: US 9,581,674 B2
(45) Date of Patent: Feb. 28, 2017

(54) DYNAMIC CALIBRATING CURRENT SENSOR

(71) Applicant: Hamilton Sundstrand Corporation, Charlotte, NC (US)

(72) Inventors: Gary L. Hess, Enfield, CT (US); Scott M. Covington, Gilbert, AZ (US); Loyal A. Wiens, Mesa, AZ (US); Eric Petersen, Phoenix, AZ (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 14/813,273

(22) Filed: Jul. 30, 2015

(65) Prior Publication Data

US 2017/0030992 A1 Feb. 2, 2017

(51) Int. Cl.
*G01R 1/02* (2006.01)
*G01R 35/00* (2006.01)
*G01R 19/32* (2006.01)

(52) U.S. Cl.
CPC ............. *G01R 35/00* (2013.01); *G01R 19/32* (2013.01)

(58) Field of Classification Search
CPC ........ G01R 13/30; G01R 17/14; G01R 17/22; G01R 31/3191; G01R 33/0017; G01R 33/0035; G05B 2219/37545; G05B 2219/39048; G05B 2219/39052; G05B 2219/42152; G07D 2205/0012; G08B 29/20; H03J 2200/29
See application file for complete search history.

(56) References Cited

U.S. PATENT DOCUMENTS 5,559,431 A * 9/1996 Sellen ................ G01N 27/9046 324/202
5,703,750 A 12/1997 Kim et al.
5,717,326 A 2/1998 Moriwaki
(Continued)

FOREIGN PATENT DOCUMENTS

DE 102014224915 A1 6/2015
GB 2345765 A 7/2000

OTHER PUBLICATIONS

European Search Report, EP16182050, Issued Dec. 6, 2016, 7 pages.

*Primary Examiner* — Tung X Nguyen
(74) *Attorney, Agent, or Firm* — Cantor Colburn LLP

(57) ABSTRACT

A dynamic calibrating current sensor control system includes an input power supply that generates an input current and a current sensor interposed between the input power supply and the load. The current sensor is configured to output at least one current signal indicating a level of current delivered to the load. The dynamic calibrating current sensor control system also comprises an electronic switching control circuit that generates at least one control signal to selectively connect the input power supply to the load, and an electronic drift suppression circuit in signal communication with the current sensor and the switching control circuit. The drift suppression circuit is configured to generate a corrected current signal in response to applying an offset value to the current signal. The offset value cancels the drift current from the current signal in response to connecting the input power supply to the load.

20 Claims, 3 Drawing Sheets

200
206
208
204
202
$I_{in}$
216
210
Output
220
218
226
Hold
Command
222
216
228
224
230
212
214

(56) References Cited

U.S. PATENT DOCUMENTS

| | | | | |
|---|---|---|---|---|
| 7,016,795 | B2 * | 3/2006 | Swedek | B24B 37/013<br>324/228 |
| 7,321,226 | B2 | 1/2008 | Yakymyshyn et al. | |
| 7,613,577 | B2 | 11/2009 | Yamaji | |
| 2007/0158607 | A1 | 7/2007 | Fey et al. | |
| 2007/0188219 | A1 | 8/2007 | Segarra | |

* cited by examiner

DYNAMIC CALIBRATING CURRENT SENSOR

TECHNICAL FIELD

The present disclosure relates generally to aerospace electronic control systems, and more particularly, to current sensors included in an electronic current control system.

BACKGROUND

Current sensor control systems are used in a variety of applications that require knowledge of the level current delivered to one or more loads. As illustrated in FIG. 1, conventional current sensor control systems 100 typically include a current sensor 102 interposed between an input power supply 104 and a load 106. The current sensor 102 is configured to output a current signal 108 indicating a level of current delivered to the load 106.

Traditional current sensors 102, however, are susceptible to current drifting. Namely, the surrounding temperature of the current sensor 102 can affect the measurement precision of the current sensor 102. In fact, the current sensor 102 may indicate false current readings even when switching control logic 110 commands a switch 112 into an open state so as to disconnect the input power supply 104 from the load 106. These imprecisions and false readings introduce undesirable errors in the output current signal 108. Many applications utilize bit circuitry 114 to diagnose the behavior of the overall system 100 including, for example, failure to distinguish between an on state and off state of the load 106. When the bit circuitry 114 is connected directly to the current sensor 102 as illustrated in FIG. 1, an output current signal 108 including drifting errors can cause the bit circuitry 114 to misdiagnose the system.

SUMMARY

According to a non-limiting embodiment, a dynamic calibrating current sensor control system comprises an input power supply that generates an input current and a current sensor interposed between the input power supply and the load. The current sensor is configured to output at least one current signal indicating a level of current delivered to the load. The dynamic calibrating current sensor control system also comprises an electronic switching control circuit that generates at least one control signal to selectively connect the input power supply to the load, and an electronic drift suppression circuit in signal communication with the current sensor and the switching control circuit. The drift suppression circuit is configured to generate a corrected current signal in response to applying an offset value to the current signal. The offset value cancels the drift current from the current signal in response to connecting the input power supply to the load.

According to another non-limiting embodiment, a method is provided to dynamically calibrate a current sensor control system. The method comprises generating an input current to drive a load, and generating a current signal indicating a current level delivered to the load. The method further includes selectively connecting the input power supply to the load, and generating a corrected current signal in response to applying an offset value to the current signal. The offset value cancels drift current from the current signal in response to connecting the input power supply to the load.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

At least one embodiment provides a dynamic calibrating current sensor control system including a current sensor interposed between an input power supply and a load. The input power supply generates an input current that drives the load, and the current sensor is configured to output a current signal indicating a current level received by the load. Unlike conventional systems including a current sensor, at least one embodiment of the disclosure provides an electronic drift current suppression circuit. The drift current suppression circuit dynamically applies an offset value to the current signal output from the current sensor so as to generate a corrected current signal. The corrected current signal cancels any drift current existing in the current signal after the input power supply is connected to the load. In this manner, the current signal output by the current sensor is dynamically corrected and calibrated such that a more accurate measurement of the current level received by the load is achieved.

Figure 1:
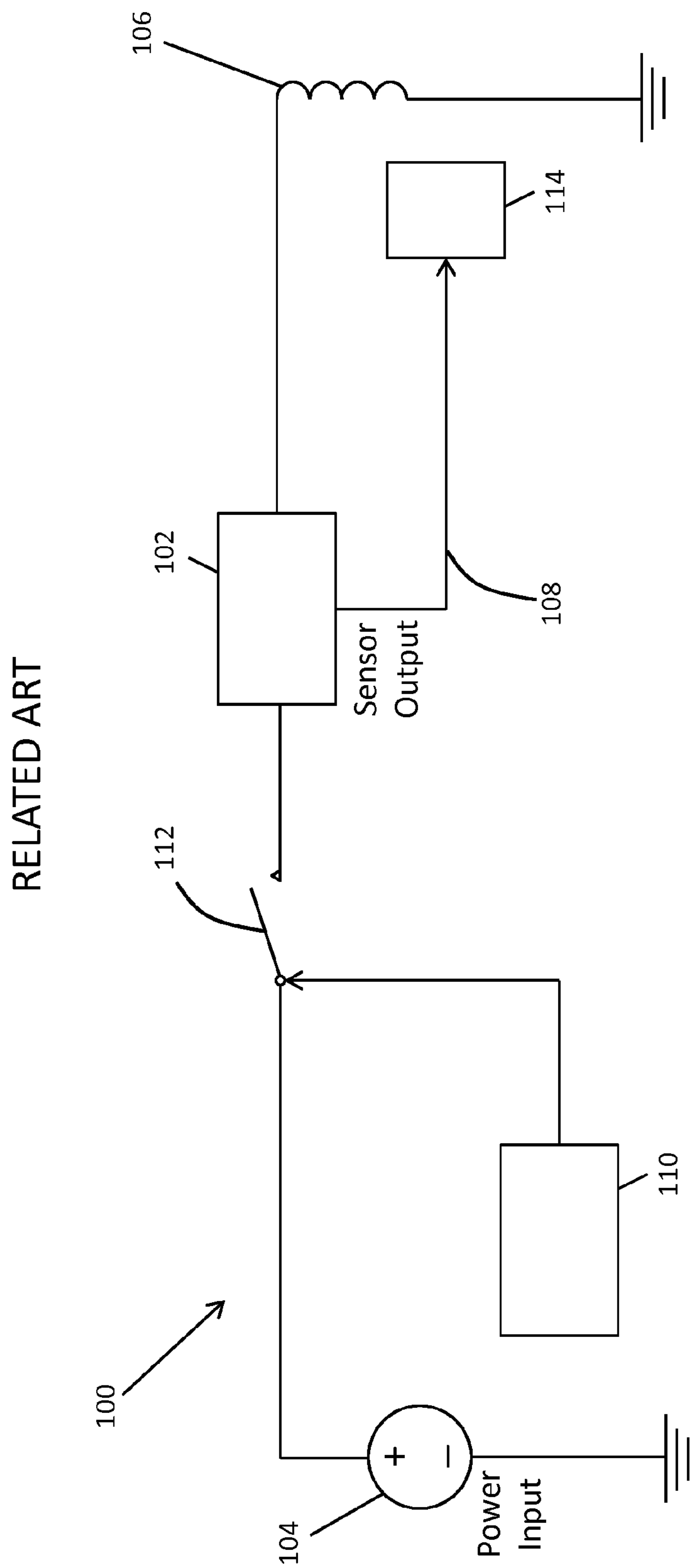
FIG. 1 is a schematic diagram of a conventional current control system.
Figure 2:
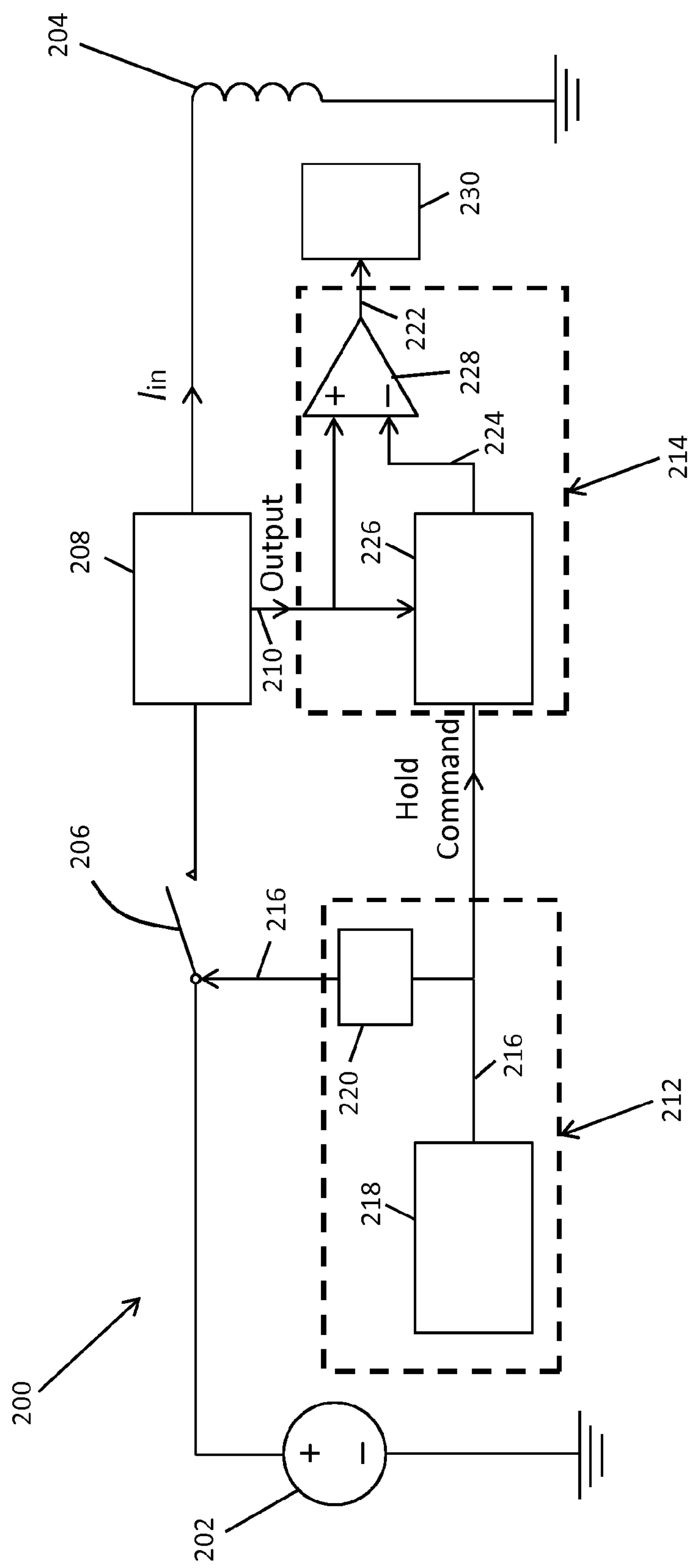
FIG. 2 is a schematic diagram of a dynamic calibrating current control system according to a non-limiting embodiment.

With reference now to FIG. 2, a dynamic calibrating current control system 200 is illustrated according to a non-limiting embodiment. The dynamic calibrating current control system 200 includes an input power supply 202 configured to generate an input current ($I_{IN}$) that drives one or more loads 204 such as, for example, a solenoid. The input power supply 202 may include, for example, a voltage supply or a current supply. In addition, the voltage supply may include, for example, an alternating current (AC) voltage supply or a direct current (DC) power supply. A switch 206 configured to selectively operate in an open state and closed state allows for the input power supply 202 to be selectively connected and disconnected to the load 204. Any switch capable of selectively establishing the connection between the input power supply 202 and the load 204 may be used including, but not limited to, a voltage controlled switch, a current controlled switch, a magnetic switch, and a hydraulic switch. A current sensor 208 is interposed between the switch 206 and the load 204, and is configured to output at least one current signal 210 indicating a level of current delivered to the load 204. The current sensor 208 may include various types of current sensors including, but not limited to, a DC current sensor, an AC root-mean-square (ACrms) sensor, and an AC peak-to-peak (ACpp) sensor.

The dynamic calibrating current control system 200 further includes an electronic switching control circuit 212 and an electronic drift suppression circuit 214. The electronic switching control circuit 212 generates at least one switch control signal 216 that controls the state of the switch 206. For example, the switch 206 is closed in response to receiving the switch control signal 216 so as to connect the input power supply 202 to the load 204, and is opened when the switch control signal 216 is inhibited from reaching the switch 206 so as to disconnect the input power supply 202 from the load 204.

According to non-limiting embodiment, the switching control circuit 212 includes an electronic switch logic circuit 218 and an electronic time delay circuit 220. The switch logic circuit 212 is configured to generate the switching signal 216 in response to various conditions including, but not limited to, data values exceeding one or more threshold values, or input control signals commanding activation and/or deactivation of the load 204. The time delay circuit 220 is configured to halt (i.e., delay) delivery of the switching signal 216 to the switch 206 for a predetermined time period. The time delay circuit 220 may include, but is not limited to, a resistor-capacitor (RC) circuit that generates a time constant matching the predetermined time period, and a digital logic timing circuit having a digital countdown timer set to the predetermined time period. A time delay input of the time delay circuit 220 is in signal communication with the switch logic circuit 218 and a time delay output is in signal communication with the switch 206. The predetermined time period for halting (i.e., delaying) the switch control signal 216 may range, for example, from approximately 1.0 microsecond (μs) to approximately 100 milliseconds (ms).

The electronic drift suppression circuit 214 is in signal communication with the current sensor 208 and the switching control circuit 212. The drift suppression circuit 214 is configured to generate a corrected current signal 222 in response to applying an offset value 224 to the current signal 210. The offset value 224 cancels any drift current from the current signal 210 in response to connecting the input power supply 202 to the load 204. The corrected current signal essentially indicates the actual current level generated by the input power supply 202, and is a different and independent signal with respect to the input current ($I_{IN}$) used to drive load 204.

According to a non-limiting embodiment, the drift suppression circuit 214 stores a first current value output by the current sensor 208 when the input power supply 202 is disconnected. Since the input power supply 202 is disconnected at this time, the first current value essentially indicates the drift current output by the current sensor 208. Accordingly, the drift suppression circuit 214 stores the first current value as the offset value which is used to correct and calibrate current signal 210 as discussed in greater detail below. When the input power supply 202 is connected to the load 204, the drift suppression circuit 214 receives a second current value output by the current sensor 208. This second current value is indicative of the current level delivered to the load 204, in addition to any drift current generated by the current sensor 208.

The drift suppression circuit 214 includes a sample and hold (S/H) circuit 226 and an electronic differential circuit 228. The S/H circuit 226 is configured to store the first current value. More specifically, the S/H circuit 226 includes a sampling input that shares a connection with the switch logic circuit 218 and the time delay input. In this manner, the S/H circuit 226 is capable of storing the first current value in response to receiving the switching signal 216 but prior closure of the switch 206.

The electronic differential circuit 228 is configured to subtract the stored first current value from the second current value in response to connecting the input power supply to generate the corrected current signal 222. More specifically, the differential circuit 228 may be constructed as a differential amplifier 228 that includes a positive terminal connected to an output of the current sensor 208, and a negative terminal connected to a sampling output of the S/H circuit 226. In this manner, negative terminal receives the stored first current value (i.e., the offset value), while the positive terminal receives the second current value. The output of the differential amplifier 222 is therefore a corrected current signal that excludes any drift current that may have existed in the current signal 210.

As described above, the current sensor 208 is dynamically calibrated such that any device connected to the drift suppression circuit 214 receives a corrected current signal absent any imprecisions or false measurements caused by drifting of the current sensor 208. For example, the system 200 may include a bit analysis circuit 230 in signal communication with the output of the differential amplifier 228 so as to receive the corrected current signal 222. Accordingly, the bit analysis circuit 230 may properly diagnose the behavior of the system 200. For instance, the bit analysis circuit 230 may properly distinguish between an on state and an off state of the load 204, whereas bit circuitry included in a conventional system may incorrectly determine a load exists in an on-state due to the additional drift current existing in the output of the conventional current sensor. Accordingly, an output of the bit circuitry 214 can be used to control the operation of the system 200, e.g., can control operation of the load 204.

Figure 3:
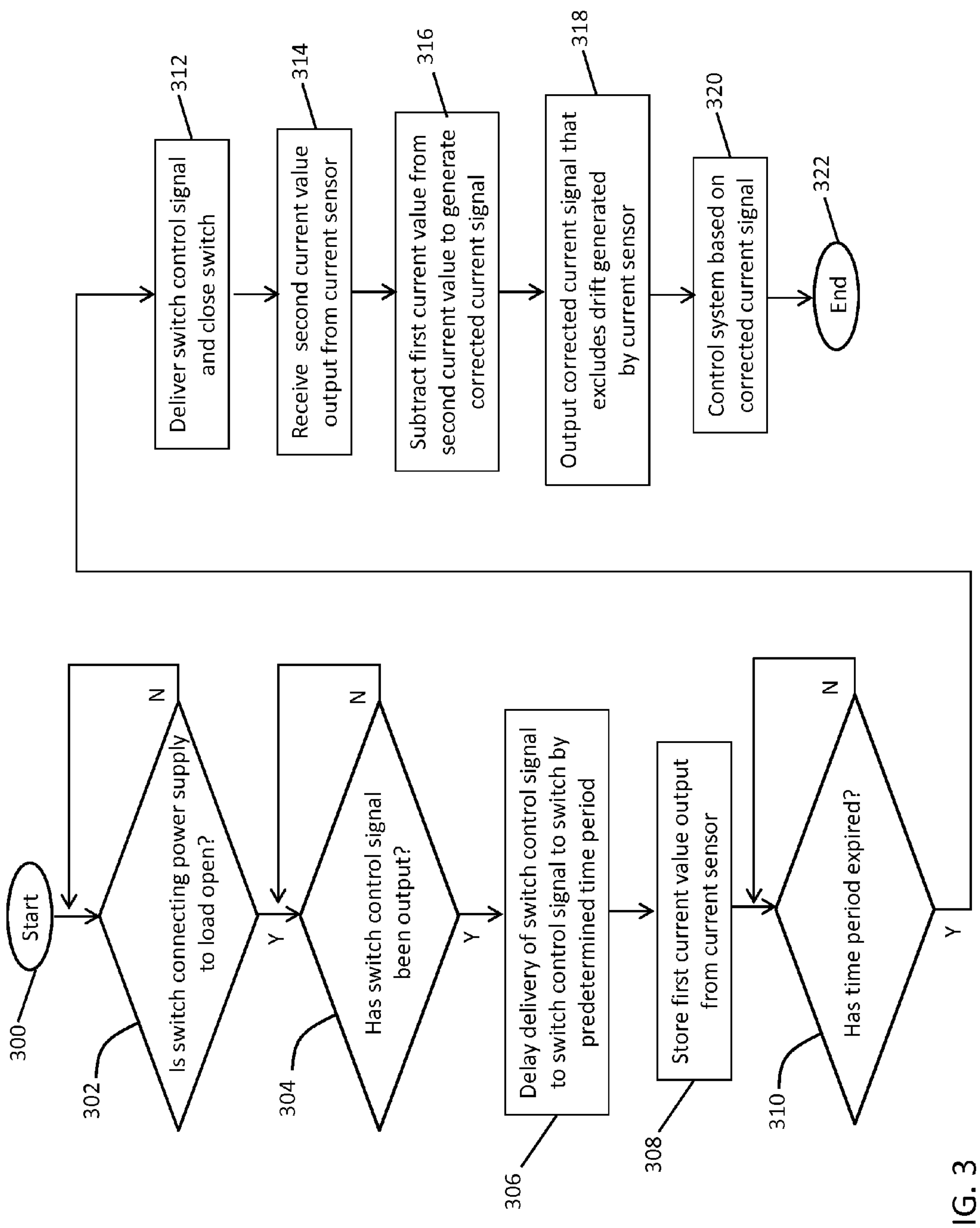
FIG. 3 is a flow diagram illustrating a method of controlling a dynamic calibrating current sensor according to a non-limiting embodiment.

Referring now to FIG. 3, a flow diagram illustrates a method of controlling a dynamic calibrating current sensor according to a non-limiting embodiment. The method begins at operation 300, and at operation 302 a state of a switch connecting an input power supply to one or more loads is monitored. When the switch is open, for example, the method returns to operation 302 and continues monitoring the state of the switch. When the switch is closed, however, the method proceeds to operation 304 to determine whether a switch control signal configured to close the switch has been generated. When the switch control signal is not generated, the method returns to operation 304 and continues to determine whether the switch control signal is generated. When the switch control signal is generated, delivery of the switch control signal to the switch is delayed for a predetermined time period at operation 306. At operation 308, a first current value output from a current sensor is stored. The current sensor is disposed, for example, between the input power supply and the load to measure a current level received by the load.

Turning to operation 310, the delay time of the switch control signal is monitored. When the predetermined time period has not expired, the method returns operation 310 and continues monitoring the remaining delay time. When the predetermined time period has expired, however, the switch control signal is delivered to the switch so as to closes the switch at operation 312. Accordingly, the input power supply is connected and drives the load via an input current at operation 312. At operation 314, a second current value is output from the current sensor. At operation 316, the first current value is subtracted from the second current value. In this manner, the second current value is offset by a value equal to the first current value stored prior to connecting the input power supply to the load. At operation 318, a corrected current signal is output which excludes any drift generated by the current sensor. At operation 320, the control system is controlled (e.g., operation of the load is adjusted) based on the corrected current signal, and the method ends at operation 322.

As described above, various non-limiting embodiments provide a dynamic calibrating current sensor control system that includes an electronic drift current suppression circuit. The drift current suppression circuit dynamically applies an offset value to the current signal output from the current sensor so as to generate a corrected current signal. The corrected current signal cancels and removes any drift errors from the current signal after the input power supply is connected to the load. In this manner, the current signal output by the current sensor is dynamically corrected and calibrated such that a more accurate measurement of the current level received by the load is achieved. Furthermore, the current sensor included in the system can be installed in a wide variety of temperature surroundings without concern of outputting a current signal including drift errors caused by changes in the surrounding temperature.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A dynamic calibrating current sensor control system, comprising:

an input power supply that generates an input current;

a current sensor interposed between the input power supply and the load, the current sensor configured to output at least one current signal indicating a level of current delivered to the load;

an electronic switching control circuit that generates at least one control signal to selectively connect the input power supply to the load; and an electronic drift suppression circuit in signal communication with the current sensor and the switching control circuit, the drift suppression circuit configured to generate a corrected current signal in response to applying an offset value to the current signal, the offset value cancelling drift current from the current signal in response to connecting the input power supply to the load.

2. The dynamic calibrating current sensor control system of claim 1, wherein the drift suppression circuit is configured to store a first current value output by the current sensor when the input power supply is disconnected from the load as the offset value, and receives a second current value output by the current sensor when the input power supply is connected to the load.

3. The dynamic calibrating current sensor control system of claim 2, further comprising an electronic bit circuit that receives the corrected current signal excluding the drift current from the drift suppression circuit.

4. The dynamic calibrating current sensor control system of claim 2, wherein the switching control circuit comprises:

a switch interposed between the input power supply and the load to selectively deliver the input current to the load in response selectively connecting and disconnecting the input power supply;

an electronic switch logic circuit configured to generate a switching signal to close the switch and connect the input power supply to the load, and to inhibit the switching signal so as to open the switch and disconnect the input power supply to the load; and an electronic time delay circuit having a time delay input connected to the switch logic circuit and a time delay output connected to the switch, the time delay circuit configured to delay delivery of the switching signal to the switch for a predetermined time period.

5. The dynamic calibrating current sensor control system of claim 4, wherein the drift suppression circuit includes a sample and hold circuit having a sampling input connected to the switch logic circuit and the time delay input, the sample and hold circuit configured to store the first current value in response to receiving the switching signal.

6. The dynamic calibrating current sensor control system of claim 5, wherein the drift suppression circuit includes an electronic differential circuit configured to subtract the first current value from the second current value in response to connecting the input power supply.

7. The dynamic calibrating current sensor control system of claim 4, wherein the time delay circuit includes one of a resistor-capacitor circuit that generates a time constant matching the predetermined time period, or a logic timing circuit that relays the switching signal after expiration of time set to a value matching the predetermined time period.

8. The dynamic calibrating current sensor control system of claim 7, wherein the predetermined time period ranges from approximately 1.0 microsecond to approximately 100 milliseconds.

9. The dynamic calibrating current sensor control system of claim 6, wherein the differential circuit is a differential amplifier including a positive terminal connected to an output of the current sensor to receive the second current value, and a negative terminal connected to a sampling output of the sample and hold circuit to receive the first current value.

10. The dynamic calibrating current sensor control system of claim 3, wherein the corrected current signal is a different and independent signal with respect to the input current delivered to the load.

11. The dynamic calibrating current sensor control system of claim 3, wherein the load is a solenoid operable in response to receiving the input power, and wherein operation of the solenoid is controlled based on an output of the bit circuit.

12. A method of dynamically calibrating a current sensor control system, the method comprising:

generating an input current to drive a load;

generating a current signal indicating a current level delivered to the load;

selectively connecting the input power supply to the load; and generating a corrected current signal in response to applying an offset value to the current signal, the offset value cancelling drift current from the current signal in response to connecting the input power supply to the load.

13. The method of claim 12, further comprising storing a first current value output by the current sensor as the offset value when the input power supply is disconnected from the load, and measuring a second current value output by the current sensor when the input power supply is connected to the load.

14. The method of claim 13, further comprising delivering the corrected current signal excluding the drift current to an electronic bit circuit.

15. The method of claim 13, wherein selectively connecting the input power supply to the load comprises:

closing a switch via a switching signal to connect the input power supply to the load, and opening the switch in response to inhibiting the switching signal to disconnect the input power supply to the load, wherein delivery of the switching signal is halted for a predetermined time period before being delivered to the switch.

16. The method of claim 15, further comprising storing the first current value in response to generating the switching signal and prior to closing the switch.

17. The method of claim 16, wherein generating the corrected current signal further comprises subtracting the first current value from the second current value in response to connecting the input power supply to the load.

18. The method of claim 12, wherein the corrected current signal is a different and independent signal with respect to the input current delivered to the load.

19. The method of claim 15, wherein the time delay circuit includes one of a resistor-capacitor circuit that generates a time constant matching the predetermined time period, or a logic timing circuit that relays the switching signal after expiration of time set to a value matching the predetermined time period.

20. The method of claim 14, wherein the load is a solenoid operable in response to receiving the input power, and wherein operation of the solenoid is controlled based on an output of the bit circuit.

* * * * *